United States Patent [19]

Takenouchi et al.

[11] 4,271,435
[45] Jun. 2, 1981

[54] SCANNING TYPE READOUT DEVICE

[75] Inventors: Mutsuo Takenouchi; Shunsuke Tomiyama; Takashi Ozawa, all of Ebina, Japan

[73] Assignee: Fuji Xerox Co., Ltd., Tokyo, Japan

[21] Appl. No.: 967,757

[22] Filed: Dec. 8, 1978

[30] Foreign Application Priority Data

Dec. 8, 1977 [JP] Japan .............................. 52-146588

[51] Int. Cl.³ .......................................... H04M 3/14
[52] U.S. Cl. ................................... 358/213; 358/256; 358/294; 250/211 J
[58] Field of Search ................... 358/213, 294, 256; 250/211 J, 211 R; 357/24, 30, 32; 315/169.1

[56] References Cited

U.S. PATENT DOCUMENTS

| | | | |
|---|---|---|---|
| 4,009,333 | 2/1977 | Berger et al. | 358/213 |
| 4,025,910 | 5/1977 | Walker | 358/213 |
| 4,025,954 | 5/1977 | Bert | 358/213 |

*Primary Examiner*—Robert L. Griffin
*Assistant Examiner*—Edward L. Coles
*Attorney, Agent, or Firm*—Sughrue, Rothwell, Mion, Zinn and Macpeak

[57] ABSTRACT

A scanning type readout device having a photoelectric conducting layer and electrode segments arranged one-dimensionally on one surface of the photoelectric conducting layer. The electrode segments are electrically insulated from each other and each has a size equal to one image element and opposite electrodes are arranged on the other side surface of the photoelectric conducting layer so that each of the opposite electrodes is in opposition to a plurality of the electrode segments. First semiconductor switches are connected respectively to the opposite electrodes and second semiconductor switches connected respectively to some of said electrode segments. A common load resistor and a power source are connected between the first and second semiconductor switches, and a scan-controller is used for opening and closing the first and second semiconductor switches in a predetermined sequence thereby to apply a voltage sequentially between the electrode segments and the opposite electrodes so that the electrode segments are scanned one-dimentionally. Either of the electrode segments or the opposite electrodes are made transparent and a light image is projected on the photoelectric conducting layer from the side of the transparent electrodes.

10 Claims, 7 Drawing Figures

F I G. 5
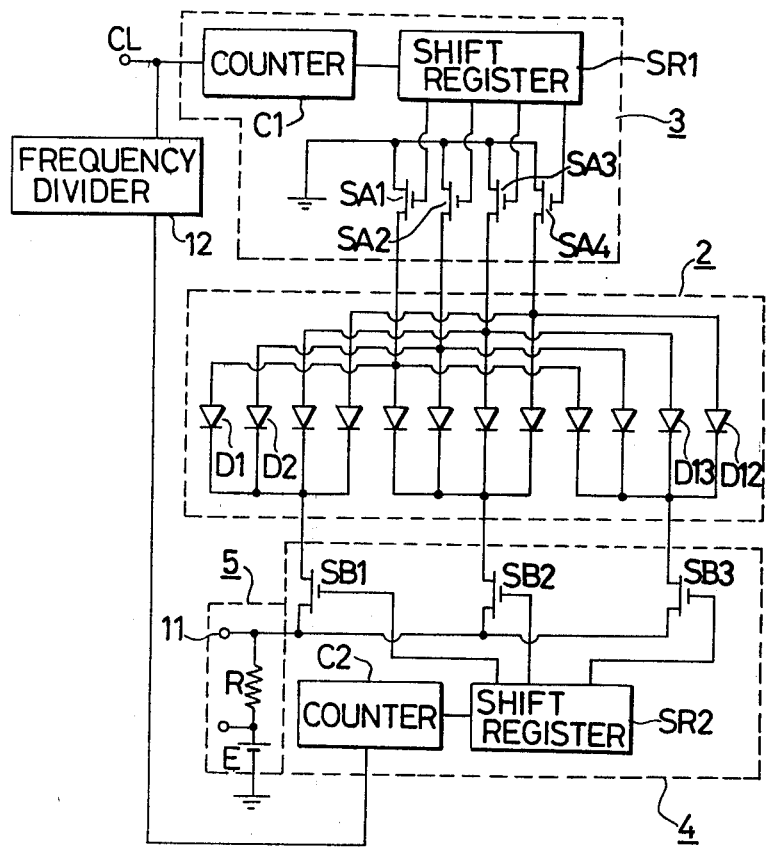

SCANNING TYPE READOUT DEVICE

BACKGROUND OF THE INVENTION

This invention relates to a scanning type readout device which converts various images of originals or the like which are hand-written, typed, or printed, into electric signals in a time-sequence. More specifically, the invention relates to a scanning type readout device of small size and low cost which comprises a plurality of photoelectric conduction cells arranged in one line. A plurality of semiconductor switches are connected to the two electrodes of the same cells for scanning the same, a signal detecting load resistance, and a constant voltage d.c. power source, together constitute a solid-state light-receiving element array. An image focusing optical system is employed for projecting the image of an original on the photoelectric conduction cells.

In facsimile telegraphy for transmitting images such as printed letters or drawings, optical readout devices of various types and complicated constructions have been heretofore used.

FIG. 1 illustrates a basic circuit of an optical diode array (PDA) known in the prior art. In this circuit, $D_1$, $D_2$, ..., $D_n$ designate photodiodes, $S_1$, $S_2$, ..., $S_n$ designate FET switches, R a load resistor, E a d.c. power source, $G_1$, $G_2$, ..., $G_n$ gates of the FET switches. The scanning circuit of the gates is composed of shift registers $S_R$.

The principle of the operation of the photodiode array can be easily understood if an element of the array is closely studied. FIG. 2 is an equivalent circuit of the element, wherein a photodiode D is represented by a parallel circuit of a photoswitch $P_D$ and a sensor capacitance or a p-n junction capacitance $C_j$. SA and SB designate scanning FET switches, and R designates the outside load resistor.

In a state where SA and SB are closed, a reverse bias voltage E is applied to the photodiode D ($P_D$ and $C_j$), and an electric charge $Q = C_j E$ is stored at the p-n junction thereof. This electric charge Q is ordinarily termed a saturated electric charge. After the termination of the charging, the switches SA and SB are opened, and immediately thereafter, the irradiation of light is started. Assuming the sensitivity of the photodiode D is IA/lux, the electric charge Q' discharged in the photodiode D at the time a light of an intensity L is irradiated during a time T can be expressed as, $$Q' = I \cdot L \cdot T$$

The product L·T at the time Q' is made equal to Q is termed the saturated light exposure. When the switches SA and SB are again closed, an electric charge corresponding to the charge Q' having been discharged within the diode is recharged. This recharging current is detected across the terminals of the load resistor R to be used as an image signal.

In the case where a plurality of photodiodes D are arranged in a series, and the switches SA and SB are opened or closed sequentially, output image signals can be picked up from a load resistor R commonly provided for these photodiodes. This feature is extremely advantageous from the view point of common use of an amplifier circuit.

Since a photodiode array or CCD sensor currently available on the market are made in an integrated circuit condition, a diminishing type optical system must be used for reading-out the original. This inevitably increases the size of the optical system and such a feature is disadvantageous for the provision of an original readout device of a reduced size. The use of a 1:1 image focusing optical system of, for instance, utilizing self-focus lenses, is also not advantageous because it requires a light receiving element array of a width equal to that of the original. Hence if the array and the associated parts are made of separate semiconductor switches available on the market, the readout device wil be excessively costly and too large in size.

SUMMARY OF THE INVENTION

Accordingly, a primary object of the present invention is to provide a scanning type readout device wherein non-silicon type field effect semiconductor switches are used, thereby reducing the size and cost of the readout device.

Yet another object of this invention is to provide a scanner type read-out device where the above described drawbacks of the conventional devices can be substantially eliminated.

Another object of the invention is to provide a scanning type readout device wherein a 1:1 image focusing optical system is used for converting an original into electric signals delivered sequentially.

Still another object of the invention is to provide a scanning type readout device wherein two semiconductor switches are used for each elementary circuit of the device, whereby a solid state scanning in one dimension is made possible by the use of the least number of electrical parts.

A further object of the present invention is to provide a scanning type readout device wherein a charging current replenishing at a high speed a discharge current integrated until the instant of the subsequent reading out is detected, so that the operational speed of the device can be substantially elevated in comparison with those utilizing real time. These and other objects of this invention are accomplished by means of a novel scanning type readout device having a photoelectric conducting layer and electrode segments arranged one-dimensionally on one surface of the photoelectric conducting layer. The electrode segments are electrically insulated from each other and each has a size equal to one image element and opposite electrodes are arranged on the other side surface of the photoelectric conducting layer so that each of the opposite electrodes is in opposition to a plurality of said electrode segments. First semiconductor switches are connected respectively to the opposite electrodes and second semiconductor switches connected respectively to some of said electrode segments. A common load resistor and a power source are connected between the first and second semiconductor switches, and a scan-controller is used for opening and closing the first and second semiconductor switches in a predetermined sequence thereby to apply a voltage sequentially between said electrode segments and the opposite electrodes so that the electrode segments are scanned one-dimensionally. Either of the electrode segments or the opposite electrodes are made transparent and a light image is projected on the photoelectric conducting layer from the side of the transparent electrodes.

The invention will now be described in detail with reference to the accompanying drawings.

BRIEF DESCRIPTION OF THE DRAWINGS

FIG. 5 shows one example of electric circuit of this invention indicating the connection between the photoconductive cells and the semiconductor switches;

DESCRIPTION OF THE PREFERRED EMBODIMENT

Figure 3:
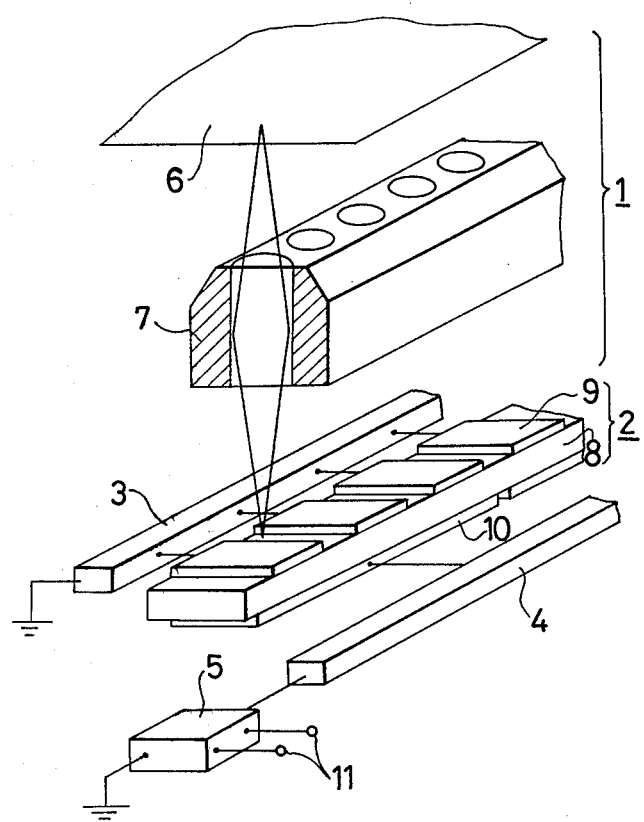
FIG. 3 is a perspective view showing the general construction of the readout device according to the present invention.

FIG. 3 illustrates in a perspective view an example of the scanning type readout device according to the present invention. In this figure, an optical system 1 is used for focusing the image of an original on to a solid state light receiving element array 2. Electrical scanning circuits 3 and 4, and a signal detector 5 will be described herein in detail. It should be noted that the description is limited to one-dimensional scanning, because the conversion of a two-dimensional image of, for instance, an original into electric signals disposed sequentially can be attained simply by adding a lateral feeding to the original or a lateral shifting of the sensor to the one-dimensional scanning of the original.

The optical system 1 for focusing the image of the original comprises an original supporting pedestal 6 and lenses 7. Since the optical system 1 is of a 1:1 image focusing type, selfocus lenses can be used for the lenses 7, and the size of the optical system can be reduced.

Figure 4:
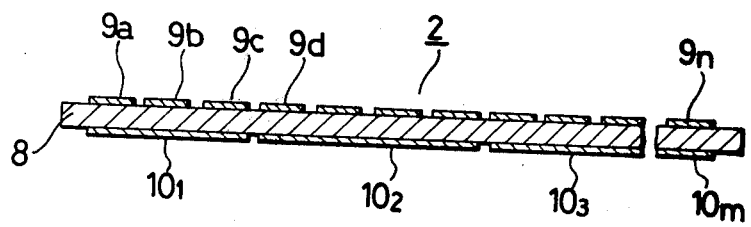
FIG. 4 is an enlarged sectional view of the photoconductive cell array of this invention.

The solid state light receiving element array 2 comprises a photoelectric conduction substance 8, transparent electrodes 9, and opposite electrodes 10. Electric scanning circuits 3 and 4 and a signal detecting circuit 5 are connected to this array. Signal detecting terminals 11 are coupled to the detecting circuit 5. The solid state array 2 is divided into an image element size and the image elements are arranged one-dimensionally. More specifically, when it is desired to convert the original into electric signals at a resolution of 8 lines per mm, the size of each segment of the light receiving element is selected to be 100 $\mu$m × 100 $\mu$m and the pitch thereof is selected to be 125 $\mu$m. The solid state light receiving element array 2 enlarged and sectioned in the array direction is shown in FIG. 4.

Figure 1:
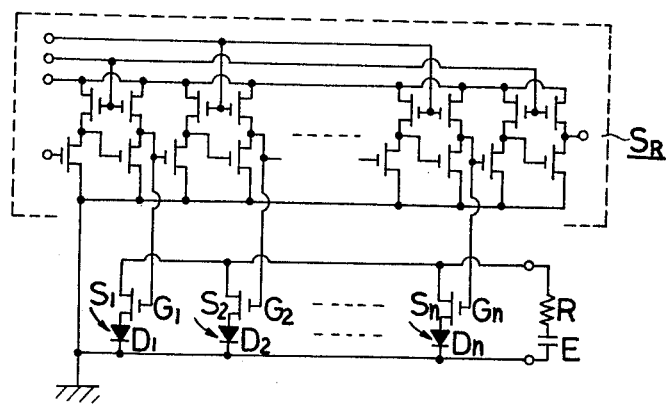
FIG. 1 is a basic circuit diagram of a conventional photodiode array.
Figure 2:
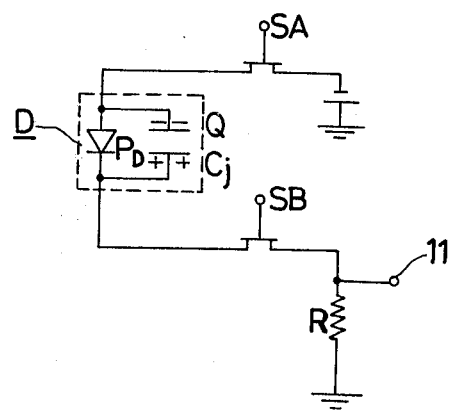
FIG. 2 is an equivalent circuit diagram concerning one of the photosensors of FIG. 1.

The photoelectric conduction substance 8 must satisfy the condition of the dark resistance more than $10^{12}$ ohm-cm, light sensitivity more than 1 pA/lux, and the light response time less than 10 m sec. These conditions can be satisfied by Se-Te alloy, CdSe, and silicon crystal of N type of P type. The transparent electrodes 9 are in this example a transparent electrically conductive film divided into segments 9a, 9b, 9c, ..., 9n each having an image element size to be read out of the original. A preferred example of such a film is $SnO_2$ or $In_2O_3$. The light image toward the solid state light receiving element array 2 is projected thereto from the side of the transparent electrodes 9. The opposite electrodes 10 in this example are also divided into m segments, each segment constituting a common electrode covering one or a plurality of the transparent electrode segments 9a, 9b, 9c, ..., 9n. The opposite electrodes 10 may be transparent or opaque, and can be easily deposited by known vacuum deposition techniques of an ordinary metal. When the opposite electrodes 10 are transparent, it is of course possible that the light image is projected from the side of the opposite electrodes 10 and the electrodes 9 are then made of an opaque material. The solid state light receiving element array 2 thus constructed is so connected that the basic circuit as shown in FIG. 2 is obtained for each of the segments. In this case, the semiconductor switches SA and SB have an ON resistance less than $10^5$ ohms and OFF resistance more than $10^{11}$ ohms, and are included in the scanning circuits 3 and 4 in FIG. 3.

The response to the light image projection is mearly the same as in the case of FIG. 2. When the switches SA and SB are both closed, an electric charge equal to the product of the sensor capacitance $C_j$ and the power source voltage E is stored. The light image is projected while either one of the switches SA and SB is opened. The electric charge is discharged by an amount corresponding to the light quantity thus projected which turns the photoelectric conduction substance 8 into the conductive state. When the switches SA and SB are again closed, a current replenishing the discharged electric charge within the sensor flows through the resistor R, and an electric signal is created across the output terminals 11. The scanning circuits 3 and 4 shown in FIG. 3 cause the switches to operate as described above. By the operation of the scanning circuits 3 and 4 including the switches SA and SB, one-dimensional scanning of the array 2 can be imparted, and the readout of the original in accordance with a time sequence is thereby accomplished.

As described hereinbefore, the light sensor in the prior art is of a comparatively large size and a disadvantageous feature of increasing the size of the switching circuits tends to occur if the selection of the parts thereof is not adequate. The use of integrated switching circuits is not practicable because of the requirement of long lead wires. According to the present invention, however, a scanning type readout device of small size and low cost and free from the above described drawback can be obtained by the use of non-silicon semiconductor switches.

FIG. 5 illustrates an example wherein the present invention is applied to a solid state light receiving element array having twelve light receiving elements. The solid state light receiving elements, that is the photoelectric conduction cells, are designated by D1, D2, ... which are the symbols designating diodes, since the transparent electrodes are made of an n-type semiconductor material such as $SnO_2$ which exhibits a diode characteristic. The above described photodiode construction is preferable over the photoelectric conduction cells because of its high S/N ratio.

In FIG. 5, like parts as in FIGS. 2 and 3 are designated by like reference numerals. SR1 and SR2 designate shift registers which control semiconductor switches SA1–SA4 and SB1–SB3 to attain the line scanning. C1 and C2 designate counters to control the shift registers SR1 and SR2, CL designates a clock signal entering into the counters C1 and C2, and element 12 is a frequency divider. By the operation of the counter C2 and the shift register SR2, either one of the semiconductor switches SB1 to SB3 is turned ON. During the ON period, other semiconductor switches SA1 to SA4 are sequentially turned into the ON state. Thus, the position where a pair of switches SA and SB inserted in the circuit of the photoelectric conduction cells D1 through D12 are simultaneously brought into ON state is shifted sequentially, and one dimensional scanning of the photoconducting cells D1 through D12 is thereby achieved. For adapting the circuit to read an original of B4 size, a number equal to 2048 of the photoconducting cells D are required. In this case, when 32 transparent electrode segments are brought into opposition to one opposite electrode segment, 32 semiconductor switches SA and 64 semiconductor switches SB are required, and the one-dimensional scanning of the 2048 photoconducting cells will be carried out by the use of altogether 96 semiconductor switches.

Figure 6:
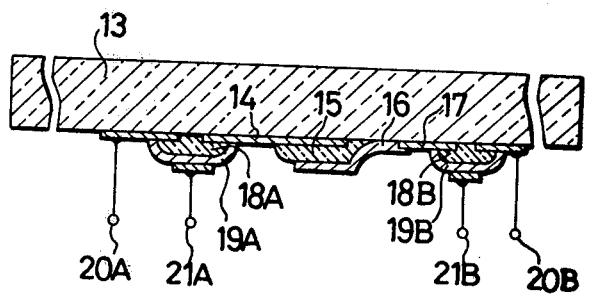
FIG. 6 is a sectional view of the light receiving portion and the semiconductor switches.
Figure 7:
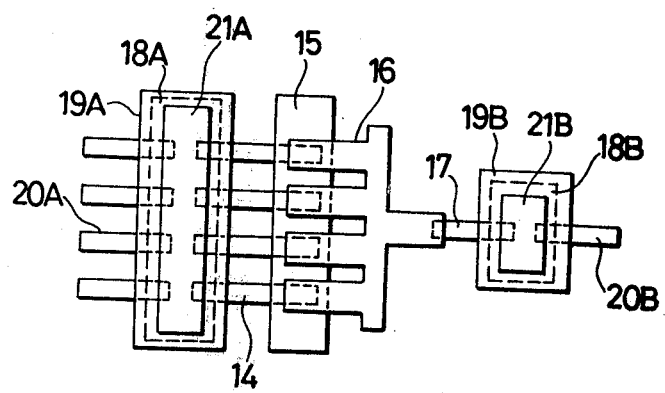
FIG. 7 is a bottom view showing one example of the electrode pattern.

One example wherein the solid state light receiving element array 2 and the semiconductor switches SA and SB are combined into one body is indicated as a sectional view in FIG. 6, amd as a bottom plan view in FIG. 7. An insulating substrate 13 comprises for instance, a glass material and transparent electrodes 14 are formed on the substrate 13. A photoconducting body 15 overlaps electrode 14 and an opposite electrode 16. A source electrode 17 couples electrode 16 to non-silicon field effect semiconductive layer 18B made of, for instance, zinc oxide, cadmium sulfide, zinc sulfide, or cadmium selenide. Layer 18A is of a similar material. Numerals 19A and 19B designate insulating layers. Drain electrodes are designated as 20A and 20B, and gate electrodes are 21A and 21B. Elements 14 through 16 constitute photoconducting cells D in FIG. 5, while elements 14, 18A through 21A constitute the switch SA and element 17, 18B through 21B constitute the switch SB. The arrangement of FIG. 7 corresponds to an electrode pattern wherein, for instance, SA1 through SA4, D1 through D4, and SB1 in FIG. 5 are formed into one block.

As will be apparent from the above description, the semiconductor switches according to this invention have a construction similar to that of MOS type switches available on the market. Furthermore, the non-silicon field effect semiconductor may be those utilized as a photosensitive body in the conventional copying machine, which can be formed into a thin layer by any convenient procedure such as a blow mixture blended with a binder or utilizing the vacuum deposition technique and is adapted to form switch groups covering a long array as in the present invention.

In the above described scanning type readout device according to the present invention, the readout circuit can be constructed in a small size and at a low cost in comparison with the case where the circuit is composed of separate semiconductor switches. It is adapted to mass production because the connection can be realized simply by a pattern process of the electrically conductive layer on the substrate.

The readout device thus constructed is similar to the construction shown in FIG. 3. The optical lens 7 in the image focusing optical system 1 may be a selfocus type lens of F 4.5 and total optical length of 60 mm. One of the scanning circuits, 3, is formed by the counter C1 and the shift register SR1 which is connected to the semiconductor switches SA. The semiconductor switches SA are in turn so connected that each of the switches SA1, SA2, . . . can switch every predetermined number of the photoconducting cells D1, D2, . . . simultaneously. The other scanning circuit 4 is formed by the counter C2 and the shift register SR2 which is likewise connected through the semiconductor switches SB to the photoconductive cells D. Hence, the switches SB1, SB2, . . . can switch a plurality of consecutive photoconductive cells simultaneously. The output terminals of the semiconductor switches SB1, SB2, . . . are all connected together and commonly connected to the resistor R of the signal detecting circuit 5. The other end of the resistor R is connected to the power source E thereby forming a closed circuit.

As will be apparent from FIG. 5, signals are read by the combination of ON states of the semiconductor switches, and therefore one-dimensional scanning is made possible by aligning the ON going directions of the shift registers SR1 and SR2. The clock signal CL is supplied to the counter C1, and through the frequency divider 12 to the counter C2. The shift registers SR1 and SR2 may be IC's SN 74154 made by Texas Instruments, Co. The semiconductor switches SA and SB are formed in alignment on the single substrate 13 as shown in FIG. 6 on which the light receiving element array D is formed.

As shown in FIG. 7, the conductor pattern formed on the insulating substrate corresponds to the circuit diagram shown in FIG. 5, providing the transparent electrodes 14 of the photoconductive cells and the source electrodes 17 and the drain electrodes 20A and 20B of the semiconductor switches on the same plane. The construction of the semiconductor switches SA and SB is as shown in FIGS. 6 and 7. The description of a typical construction follows in which the demensions are solely for proposes of illustration. In all of the switches, the gap between the source electrode and the drain electrode is 10 $\mu m$, the field effect semiconductive layers 18A and 18B are made of CdS of 2 $\mu m$ thickness, the insulating layers 19A and 19B are made of $SiL_2$ of 1 $\mu m$ thickness, and the gate electrodes 21A and 21B are made of aluminum foil. The photoconductive cells D are made in such a manner that the transparent electrodes 14 made of $SnO_2$ each having the size of 100 $\mu m \times 500$ $\mu m$ are provided at a pitch of 125 $\mu m$ on the insulating substrate 13. Then the photoconductive layer 15 made of Se-Te alloy and of 100 $\mu m$ width and 2 $\mu m$ thickness is deposited over the transparent electrodes 14. On this layer 15, the opposite electrodes 16 made of gold are vapor deposited to extend over the 16 transparent electrodes 14. The electrodes 16 are connected to the source electrode 17 of the other semiconductor switch SB by the use of a wire bonder or by another overlaid vapor deposition.

An example of the readout device according to the present invention was constructed as described above, one dimensional pattern of an original image was projected on the solid state light receiving elements, and the electrical scanning circuits 3 and 4 started their operation. The output signal was applied to a storage type oscilloscope to be visualized therein. The display on the oscilloscope was found to conform to the projected optical image.

It is apparent that modification of this invention are possible without departing from the essential scope of the invention.

We claim:

1. A scanning type readout device comprising, a photoelectric conducting layer, electrode segments arranged one-dimensionally on a first surface of the photoelectric conducting layer, said electrode segments being electrically insulated from each other and each having a size equal to one image element; opposite electrodes arranged on a second surface of the photoelectric conducting layer opposite said first surface so that each of the opposite electrodes is in opposition to a number of said electrode segments; first semiconductor switch means connected respectively to the opposite electrodes; second semiconductor switch means connected respectively to said electrode segments, a common load resistor and a power source connected between said first and second semiconductor switch means, and scan-controlling means for opening and closing said first and second semiconductor switch means in a predetermined sequence thereby to apply a voltage sequentially between said electrode segments and said opposite electrodes wherein the electrode segments are scanned one-dimensionally; at least either said electrode segments or said opposite electrodes being transparent; and a light image is projected on the photoelectric conducting layer from the side of said transparent electrodes.

2. A scanning type readout device as set forth in claim 1 characterized in that at least one of said first and second semiconductor switch means is composed of a source electrode and a drain electrode disposed in opposition with the interposition of a non-silicon field effect semiconducting layer, and of a gate electrode opposing said two electrodes.

3. The scanning readout device of claim 1 wherein each opposite electrode is in opposition to the same number of electrode segments and said first semiconductor switching means comprises a number of semiconductor switches equal to the number of opposite electrodes.

4. The scanning readout device of claims 1 or 2 wherein the number of electrode segments opposed by opposite electrode forms a group of segments and said second semiconductor switch means comprises a number of semiconductor switches equal to the number of segments in one group.

5. A scanning type readout device as set forth in claim 1 or 2 characterized in that the opposite electrodes are respectively connected through the first semiconductor switch means to said common load resistor, said plurality of electrode segments opposed by each one of said opposite electrodes forming one group, the electrode segments arranged in each corresponding positions in such groups are electrically connected together and connected through each of the second semiconductor switch means to said power source, and the electrode segments are one-dimensionally scanned through the transparent electrode under the control of the first and second semiconductor switch means.

6. The scanning readout device of claim 1 wherein said electrode segments are transparent, further comprising optical means to focus said light image through said electrode segments on to the photoelectric conducting layer.

7. The scanning readout device of claim 1 wherein said opposite electrodes are transparent, further comprising optical means to focus said light image through said opposite electrodes on to the photoelectric conducting layer.

8. The scanning readout device of claims 6 or 7 wherein said optical means comprises a 1:1 image focusing optical system including selfocus lenses.

9. The scanning readout device of claims 1, 2 or 3 wherein said scan-controlling means comprises a first shift register controlling said first semiconductor switch means, a second shift register controlling said second semiconductor switch means and counter means associated with said shift registers to selectively control said shift registers in response to an input signal.

10. The scanning readout device of claim 5 wherein said scan-controlling means comprises a first shift register controlling said first semiconductor switch means, a second shift register controlling said second semiconductor switch means and counter means associated with said shift registers to selectively control said shift registers in response to an input signal.

* * * * *